United States Patent
Krogdahl et al.

(10) Patent No.: US 10,688,624 B2
(45) Date of Patent: Jun. 23, 2020

(54) ELECTRONIC DEVICE STRUCTURE FORMED FROM POROUS METAL BONDED TO PLASTIC

(71) Applicant: Apple Inc., Cupertino, CA (US)

(72) Inventors: James R. Krogdahl, Cupertino, CA (US); Derek C. Krass, Cupertino, CA (US); Paul Choiniere, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 207 days.

(21) Appl. No.: 15/267,081

(22) Filed: Sep. 15, 2016

(65) Prior Publication Data

US 2017/0094824 A1    Mar. 30, 2017

Related U.S. Application Data

(60) Provisional application No. 62/235,524, filed on Sep. 30, 2015.

(51) Int. Cl.
| | | |
|---|---|---|
| *B24C 1/04* | (2006.01) | |
| *C25D 11/04* | (2006.01) | |
| *B29C 45/14* | (2006.01) | |
| *H04M 1/02* | (2006.01) | |
| *H05K 5/06* | (2006.01) | |
| *B29K 101/12* | (2006.01) | |
| *B29K 705/00* | (2006.01) | |
| *B29K 105/20* | (2006.01) | |

(52) U.S. Cl.
CPC .......... *B24C 1/04* (2013.01); *B29C 45/14311* (2013.01); *C25D 11/04* (2013.01); *H04M 1/0283* (2013.01); *H05K 5/065* (2013.01); *B29C 45/14795* (2013.01); *B29K 2101/12* (2013.01); *B29K 2105/20* (2013.01); *B29K 2705/00* (2013.01)

(58) Field of Classification Search
None
See application file for complete search history.

(56) References Cited

U.S. PATENT DOCUMENTS

2006/0257624 A1*  11/2006  Naritomi ........... B29C 45/14311
                                                 428/141
2016/0089792 A1    3/2016  Ojalehto et al.

* cited by examiner

*Primary Examiner* — Scott R. Walshon
*Assistant Examiner* — Elaine M Vazquez
(74) *Attorney, Agent, or Firm* — Brownstein Hyatt Farber Schreck, LLP

(57) ABSTRACT

A composite material is disclosed which includes a plastic layer formed on a layer of metal. The metal layer includes pores into which an adhesive is introduced. The plastic layer is injection molded onto the metal layer so as to contact the adhesive in the pores. The plastic layer is thus bonded to the metal layer.

9 Claims, 4 Drawing Sheets

ELECTRONIC DEVICE STRUCTURE FORMED FROM POROUS METAL BONDED TO PLASTIC

CROSS-REFERENCE TO RELATED APPLICATION

This application is a nonprovisional patent application of U.S. Patent Application No. 62/235,524, filed Sep. 30, 2016 and titled "Electronic Device Structure Formed from Porous Metal Bonded to Plastic," the disclosure of which is hereby incorporated herein by reference in its entirety.

FIELD

The described embodiments relate generally to a structure formed from a metal bonded to a plastic, and more particularly to a structure for an electronic device formed from a porous metal bonded to a plastic by an adhesive within the pores of the metal.

BACKGROUND

Injection molding is widely used method of manufacturing plastic parts for modern devices such as portable electronic devices. Injection molding techniques can produce high volumes of the same object in a cost effective manner. Thermoplastic and thermosetting polymers are widely used in injection molding. Common polymers like epoxy and phenolic resin are examples of thermosetting plastics while nylon, polyethylene, and polystyrene are common thermoplastics.

Portable electronic devices have become popular in recent years. These devices have become a mainstay in society and are used for communication, information and entertainment. In some ways portable electronic devices have become a status symbol and users want them to be aesthetically pleasing as well as functional. Because users carry these devices throughout the day and in many environments, the devices must be durable as well as functional and aesthetically pleasing.

In many instances, portable electronic devices include housings or other components which are durable and can withstand the environmental conditions as well as the stress and strain imposed as a result of user activities and, in some cases, abuse.

In some portable electronic devices, thermoplastic components may be molded directly onto metal surfaces to provide waterproofing as well as decorative and aesthetically pleasing surfaces on the device. Waterproof thermoplastic surfaces do not rust or corrode and thus are preferred over some metal surfaces which may not be as resistant to these elements. In addition, in order to protect the metal surface and certain electronic components, a watertight seal may be desirable between the thermoplastic material layer and the metal housing of the device.

SUMMARY

One embodiment described herein takes the form of a structure for an electronic device, comprising: a metal surface defining pores therein; an adhesive within the pores; and a plastic abutting the metal and adhesive; wherein the adhesive is bonded to the metal; the adhesive is bonded to the plastic; the plastic is bonded to the metal; and a first bond strength between the plastic and the metal is less than both of a second bond strength between the plastic and the adhesive, and a third bond strength between the metal and the adhesive.

Another embodiment described herein takes the form of a method for forming a multi-layered material, comprising: forming a group of pores in a first surface; applying an adhesive to the surface and into the pores; partially curing the adhesive such that at least some of the adhesive cures in at least some of the pores; molding a layer of plastic material on the first surface, overlying the pores; and curing the plastic layer and the adhesive together.

Still another embodiment described herein takes the form of a method for manufacturing a housing for a portable electronic device, comprising: forming a group of voids in a metal surface; introducing an adhesive into the voids and onto the metal surface; injection molding a thermoplastic layer on the adhesive; and curing the thermoplastic layer and adhesive at the same time.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1:
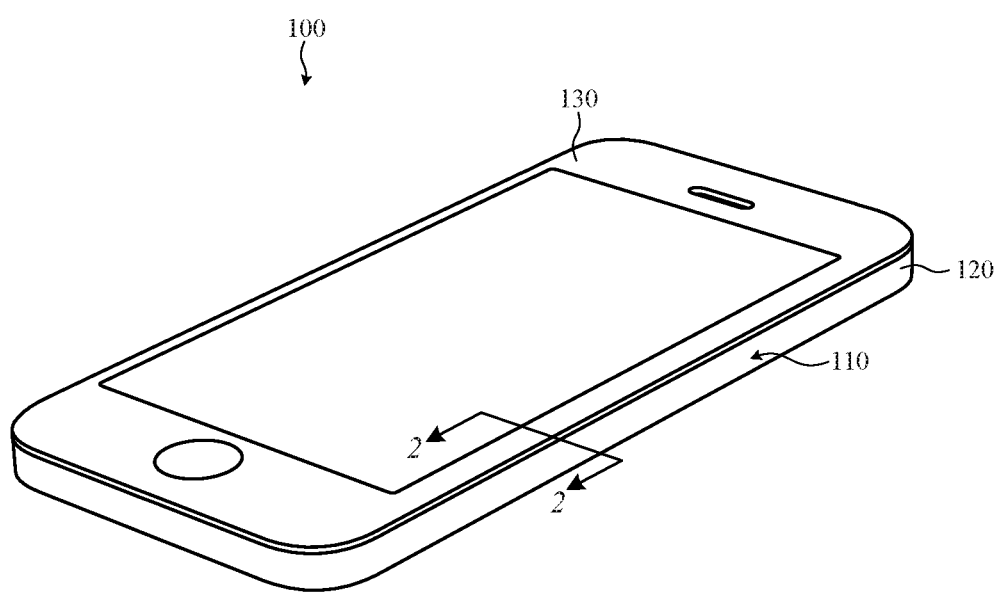
FIG. 1 shows a sample electronic device having a housing that may be formed from a metal bonded to a plastic.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

Embodiments described herein generally relate to bonding a plastic to a metal, and more particularly to filling pores or other apertures in the metal with a material that bonds more strongly with the plastic than does the metal alone. Typically, the material filling the pores may create a chemical or mechanical bond having higher bond energy than a metal-plastic bond. The material may be an adhesive, such as a heat-curable adhesive, in certain embodiments.

Pores may be formed in the metal substrate by chemically etching the metal, using nano-molding technology to create pits or other apertures in the metal, blasting the metal, abrading the metal, and so on. The resulting pores (or other apertures) may accept the adhesive, which may fully or partially fill the pores. The adhesive may be sprayed or brushed on, or otherwise deposited. In some embodiments, the metal may be dipped in the adhesive.

Excess adhesive may be removed from the metal surface such that the adhesive remains in the pores but is not otherwise present on or in the metal. It should be understood that removing the adhesive is optional and many embodiments may leave adhesive on the metal. The adhesive may be wiped away, exposed to a solvent, or the like. In some embodiments, a solvent may be mixed in or otherwise incorporated into the adhesive, which may lower a viscosity of the adhesive and permit it to flow into a pore having a relatively small aperture.

The plastic is overmolded to the metal substrate and adhesive. Typically, the plastic is molded to the metal at a sufficiently high temperature to cure the adhesive. Thus, the molding process not only deposits and forms the plastic, but also creates chemical and/or mechanical bonds between the metal and the adhesive, and the adhesive and the plastic (as well as, optionally, the plastic and the metal). In addition to the chemical bonds with the adhesive, the metal and plastic may mechanically interlock if portions of the plastic enter the pores, for example because the adhesive does not completely fill all of the pores.

After molding, the plastic, metal and adhesive structure may be heat cured to finally set the adhesive and cure the plastic. It should be appreciated that heat curing the structure is optional; certain embodiments may employ plastics and/or adhesives that do not require heat curing.

The resulting structure has high bond strength between the various components, and particularly between the adhesive and the metal, and the adhesive and the plastic. These adhesive bonds are generally stronger (e.g., have a higher bond strength) than a bond between the plastic and the metal. Accordingly, multi-layer structures as described herein so may be more structurally sound than other structures made from plastic molded to metal. Accordingly, structures as described herein may be resistant to shock and impact, insofar as the plastic and metal may withstand more force before delaminating from one another. Thus, structures formed as described herein may be particularly suitable for use as electronic device housings.

FIG. 1 shows a sample electronic device 100, here embodied as a mobile phone. The electronic device 100 has a housing 110, including a metal body 120 and a plastic section 130. The plastic section 130 may be transparent in certain embodiments and may form a cover surface through which a user may view a display. Accordingly, the term "cover surface" may be used herein to refer to the plastic section.

The metal body 120 forms a base and portions of the sidewalls of the electronic device 100; in other embodiments, the metal body 120 may form more or less of the housing 110. Likewise, the cover surface 130 extends partially along sidewalls of the housing 110, but may form more or less of the housing in other embodiments. For example, the metal body 120 may form an entirety of one or more sidewall exteriors in some embodiments.

Figure 2:
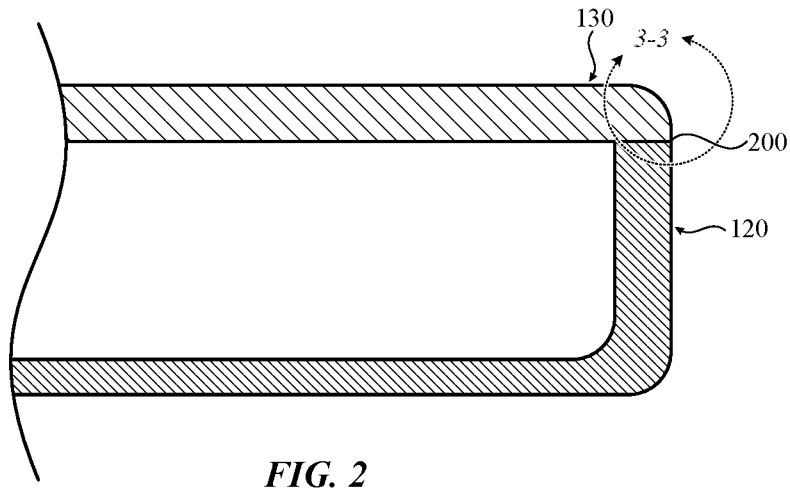
FIG. 2 is a cross-section view taken along line 2-2 of FIG. 1.

FIG. 2 is a cross-sectional view taken along line 2-2 of FIG. 1, showing a portion of the electronic device 100. FIG. 2 particularly illustrates the cover surface 130 and metal body 120 in cross-section, showing a sample seam or joint between the two. It should be appreciated that internal components of the electronic device 100 have been omitted for clarity.

As illustrated, the plastic cover surface 130 overlies and abuts the metal body 120 at a joint 200. The cover surface 130 is affixed to the metal body 120 at the joint. The metal body 120 and cover surface 130 may be chemically and/or mechanically bonded to one another at the joint 200.

Although the joint 200 is shown as a straight, flat joint, the joint 200 may have a variety of shapes and/or configurations. For example, the metal body 120 may define an interior step or ledge in which the plastic surface 130 rests. In such an embodiment, the joint 200 may form a right angle such that first and second surfaces of the metal abut first and second surfaces of the plastic. Likewise, the joint 200 may be a combination of various complex shapes and need not have a constant cross-section, dimension, or other shape or configuration.

Figure 3:
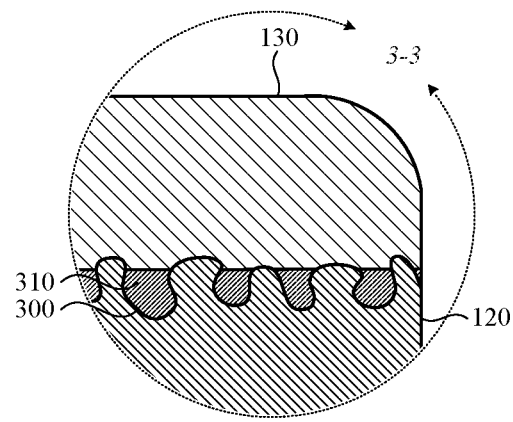
FIG. 3 is a detail view of region 3-3 of FIG. 2.

In certain embodiments, the cover surface 130 and metal body 120 may be bonded with an intermediate material, such as an adhesive. FIG. 3 is a detail view of area 3-3 shown in FIG. 2, illustrating the joint 200 in magnified detail. It should be appreciated that certain features have been exaggerated in FIG. 3 for purposes of illustration.

One or more pores 300 may be defined in an upper surface (e.g., a surface at or partially forming the joint 200) of the metal body 120. The pores may be formed in the metal body by any suitable process, including chemical etching, abrasion, nano-molding technology, particulate blasting, and so on. The pores need not be especially wide or deep. For example, the pores may not be visible to the unaided human eye. Rather, the pores' dimensions need only be sufficient to permit ingress of adhesive 310. In some example embodiments, the pores may range in depth and/or opening size from about one micron to about 100 microns.

Adhesive 310 may fill or partially fill the pores 300, or a number of the pores 300. The adhesive may be heat-curable in certain embodiments. Alternatively, the adhesive may cure with time at or near room temperature, with irradiation, or the like. In some embodiments, the adhesive may be chemically cured.

Typically, the adhesive fills some portion of the pores, but there is no requirement that it fill all of the pores (although it may, in some cases). Example adhesives include phenols, polyurethanes, polyimides, epoxies, and so on. The adhesive is often liquid when applied to the pores 300 of the metal substrate 120, but may be a paste, film, pellet, tape, or the like in various embodiments. For example, the adhesive 310 may be a pressure-sensitive adhesive applied to fill (or partially fill) the pores. As another example, the adhesive 310 may be a liquid that is brushed or sprayed onto the metal substrate 120 and thus enters the holes 300. In embodiments where the joint 200 is a multi-surface joint, each surface of the joint may have pores defined therein and any or all of the pores may contain adhesive. Accordingly, embodiments may have multi-surface joints 200 defining multiple attachment surfaces between a plastic and a metal.

The plastic material 130 (here, forming the cover surface) abuts the metal substrate 120 and the adhesive 310 within the pores 300. The plastic material 130 may be molded or otherwise deposited atop the metal substrate 120 (e.g., the body) and the adhesive 310 at the joint 200. Typically the plastic material is injection molded or compression molded to abut the metal substrate and adhesive; accordingly, the plastic material is typically molten when deposited. Insofar as the plastic material 130 is liquid above a certain transition temperature, it may be considered a thermoplastic.

The heat of the plastic material 130, when applied to the metal substrate 120 and adhesive 310, may heat cure the adhesive 310 within the pores 300. The adhesive may be fully or partially cured in this manner. Curing the adhesive within the pores, while the plastic material abuts the adhesive, may result in a relatively strong chemical bond between the plastic material 130 and the adhesive 310, as well as between the adhesive 310 and the metal substrate 120. Likewise, once cured the adhesive 310 may be mechanically bonded to the metal substrate 120, insofar as it hardens in the pores 300. The adhesive 310 may also form a mechanical bond with the plastic material 130 as either or both of the plastic material and the adhesive cure.

As an alternative, the adhesive 310 may be partially cured prior to introducing the plastic material 130. A partially cured adhesive may be less prone to being forced from the pores 300 during a molding process in which the plastic material 130 is introduced. In some examples, a temperature of about 50° C. may be suitable to partially cure the adhesive. The curing cycle for the injection molded product may include subjecting the adhesive to a temperature of 100° C. or higher, which fully cures the adhesive. In some embodiments, temperatures of up to 300° C. or higher may also be used to fully cure the thermoplastic and adhesive materials.

In certain embodiments, the multi-layered structure of the plastic material 130, the adhesive 310, and metal substrate 120 may have sufficiently strong and structurally dense bonds between contiguous surfaces formed by the plastic, adhesive and metal, to render the structure liquid-tight. This may be useful if the structure is an electronic device housing, insofar as a liquid-tight bond may protect components within the housing 110 from water damage or the like.

In addition to providing a waterproof or other liquid-proof bond, the strength of the bonds between the materials 120, 130, 310 may provide some degree of impact resistance to the electronic device 100. The increased bond strength thus results in a sturdier, more durable product. The embodiments described herein may also eliminate the need for complex manufacturing processes to create interlocking or other features on the surface of the metallic substrate to increase the bonding of the thermoplastic layer to the metallic substrate. The tight bond also eliminates or reduces any gap between these surfaces which may be unsightly and diminish the user's perception of the aesthetic value of the portable electronic device.

Figure 4:
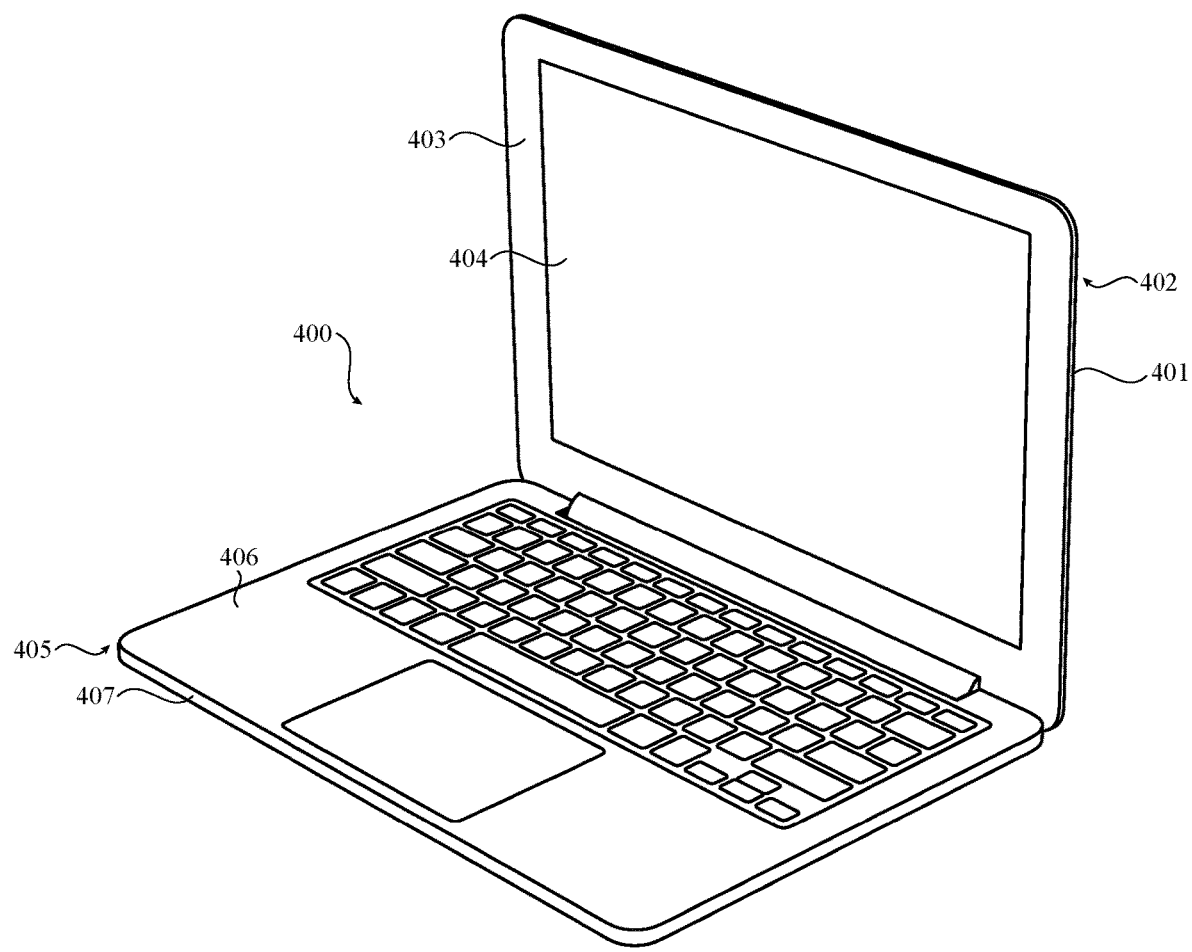
FIG. 4 shows a second sample electronic device having a housing that may be formed from a metal bonded to a plastic.

FIG. 4 illustrates another sample electronic device 400, namely a laptop computer. The electronic device 400 has a housing 405 that may be formed from a plastic material 130 and porous metal 120 bonded by an adhesive 310. As with other structures discussed herein, any portion of the electronic device housing 405 may be formed from either or both of a metal and a plastic. For example, in some embodiments a top case 402 may have a top body 401 formed from a metal and a front surface or bezel 403 (for example, surrounding display 404) formed from a plastic. The metal and plastic may be bonded together as described herein to form the top case 402.

Similarly, bottom case 405 may be formed from a top surface 406 and bottom body 407. One of the top surface 406 and bottom surface 407 may be a metal, while the other is a plastic, and the two may be bonded together by an adhesive in pores of the metal to form the top surface.

In some embodiments, the metal (such as a part of a top case 402 and/or bottom case 405) of an electronic device may be aluminum. The aluminum may be anodized, and the pores discussed herein may be formed as part of the anodization process and in an anodization layer of the metal. Accordingly, when anodized aluminum is used as the metal 120, a separate pore formation process may be omitted.

Figure 5:
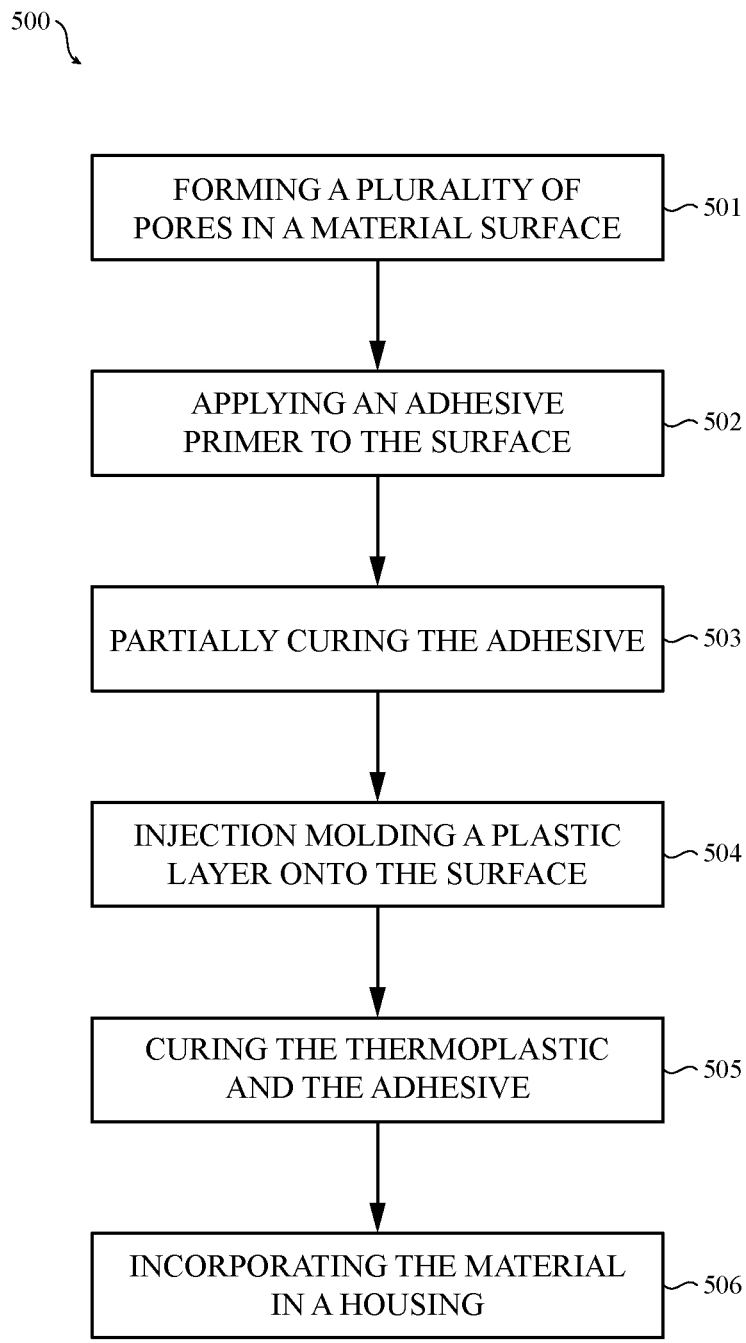
FIG. 5 is a flow chart illustrating a method for making a multi-material housing.

FIG. 5 is a flow chart illustrating a method 500 for manufacturing a housing for a portable electronic device, such as those shown in FIGS. 1 and 4. It should be appreciated, however, that the method described below and embodiments described herein may be used to form, or as, a housing for substantially any electronic device, including tablet computing devices, media players, wearable devices, and so on. Further, embodiments described herein may be used to form a wide variety of products, including appliances, electronics, jewelry, and so forth.

In operation 501, pores or voids are formed in a metal or other hard surface material. These voids may be formed by etching or laser etching, machining, particle blasting, or by other processes that generate depressions or pores in the surface of the metal. A nano-molding technology process may also be used to form the pores.

In operation 502, an adhesive is applied to the surface of the metal (or other material). Sample adhesives include which may be polyurethane, epoxy, acrylic or other heat reactive adhesive. The adhesive may be applied by brushing, rolling or spraying it on the surface such that it enters the pores that have been created in the surface. In some embodiments, the entire surface may be dipped into or submerged under the adhesive so as to coat the surface and permit the adhesive to enter the pores. In some embodiments, the adhesive may be injected into the pores. In some embodiments, the adhesive may be mixed with a low viscosity solvent to enhance its penetration ability and allow it to enter the pores or voids in the metallic surface.

In optional operation 503, the adhesive may be at least partially cured within the pores. This partial curing may enhance the ability of the adhesive to remain in the pores during an injection molding process, in which a plastic is molded abutting the adhesive and metal. In some embodiments, a cure temperature may be about 50° C., which is suitable to at least partially cure a polyurethane adhesive, for example. The curing temperature is below the adhesive activation temperature and thus the adhesive may not fully cure. By leaving the adhesive partially uncured, it may later bond to the plastic and to the metal. In some embodiments, operation 503 may be omitted and the thermoplastic layer may be molded directly onto the uncured adhesive.

In operation 504, a plastic material (such as a thermoplastic) is molded onto or abutting the metallic substrate and the adhesive in the pores of the metallic substrate. The plastic material may be a thermoplastic, and may be injection molded in operation 504, although other embodiments may use different plastics and/or different molding techniques. The molding operation is accomplished at a temperature sufficient to cure the adhesive and form a bond between the adhesive and the metal, and between the adhesive and the plastic.

In optional operation 505, the thermoplastic layer and the metallic substrate may be subjected to additional heating to fully cure the adhesive and form the bond between the thermoplastic layer and the metallic substrate.

Operation 506 may optionally include incorporating the substrate and thermoplastic layer into a housing which may be used with a portable electronic device. In optional operation 506, the metallic substrate may be anodized prior to incorporating it into the housing, although in other embodiments the metal substrate may be anodized prior to the process 500.

Although embodiments described herein have been discussed with respect to forming a housing of an electronic device, it should be appreciated that any number of different structures may be formed. Similarly, the plastic may form a part of a structure other than a cover surface. For example, the plastic may form a logo, graphic or other design. Such designs may be formed or embedded in a metal substrate; in some embodiments, an upper surface of the metal substrate and the plastic may be flush or otherwise coplanar. Accordingly, the number and variety of structures, shapes, features and the like that may be formed by the embodiments described herein is large.

The foregoing description, for purposes of explanation, used specific nomenclature to provide a thorough understanding of the described embodiments. However, such nomenclature and the examples provided herein are illustrative, rather than setting forth specific limitations. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. A structure for an electronic device, comprising:
a metal having a surface defining pores therein;
an adhesive partially filling the pores such that a portion of the surface between the pores is free from the adhesive; and
a plastic defining:
   first portions abutting the metal along the portion of the surface between the pores; and
   second portions extending into the pores and abutting the adhesive, wherein:
the adhesive is bonded to the metal;
the adhesive is bonded to the plastic;
the plastic is bonded to the metal;
a first bond strength between the plastic and the metal is less than a second bond strength between the plastic and the adhesive; and
the first bond strength is less than a third bond strength between the metal and the adhesive.

2. The structure of claim 1, wherein the metal comprises aluminum.

3. The structure of claim 1, wherein the pores are generated by one of etching; laser etching; aggregate blasting; or nano-molding.

4. The structure of claim 1, wherein the pores are about one micron in at least one of depth or width.

5. The structure of claim 4, wherein the pores are irregularly shaped.

6. The structure of claim 1, wherein the adhesive includes a solvent.

7. The structure of claim 1, wherein:
the plastic abuts the metal at a multi-surface joint; and
the pores are formed in multiple surfaces of the metal abutting the plastic at the multi-surface joint.

8. The structure of claim 7, wherein the plastic forms a transparent cover surface.

9. The structure of claim 8, wherein the plastic forms a graphic embedded in the metal.

* * * * *